United States Patent [19]

Wagner

[11] Patent Number: 5,121,065
[45] Date of Patent: Jun. 9, 1992

[54] MIXED DOMAIN MIXED RATIO FREQUENCY RESPONSE SAMPLING

[75] Inventor: Douglas R. Wagner, Monroe, Wash.

[73] Assignee: Hewlett-Packard Company, Palo Alto, Calif.

[21] Appl. No.: 553,539

[22] Filed: Jul. 13, 1990

[51] Int. Cl.[5] .......................................... G01R 19/00
[52] U.S. Cl. ................................ 324/607; 324/605; 324/615; 324/78 D; 364/553; 364/572; 364/724.10; 341/123
[58] Field of Search ............... 324/603, 605, 615, 618, 324/77 B, 79 D; 364/724.10, 553, 481, 484, 485, 576, 572; 341/110, 123

[56] References Cited

U.S. PATENT DOCUMENTS

| | | | |
|---|---|---|---|
| 4,542,336 | 9/1985 | Powell | 324/77 B |
| 4,604,717 | 8/1986 | Kaplan | 364/576 |
| 4,621,254 | 11/1986 | Belcher | 341/122 |
| 4,638,248 | 1/1987 | Schweickert | 324/77 B |
| 4,700,174 | 10/1987 | Sutherland | 364/571.02 |
| 4,715,000 | 12/1987 | Premerlani | 364/484 |
| 4,740,744 | 4/1988 | Lubarsky | 324/79 D |
| 4,918,637 | 4/1990 | Morton | 364/724.17 |
| 4,930,513 | 6/1990 | Mayo | 73/861.25 |

Primary Examiner—Gerard R. Strecker
Assistant Examiner—Jose M. Solis

[57] ABSTRACT

Aliasing and synchronization difficulties in determining transfer functions in mixed domain (analog and digital) systems are overcome by sampling the analog signal at an integer multiple of the digital signal, and zero filling the set of sampled digital data so that the sampled digital data corresponds to the more densely sampled analog data. By so doing, a single fixed frequency anti-alias filter in the analog channel can be used to avoid aliasing problems in mixed domain measurements over any span of frequencies, up to the entire passband of the filter.

10 Claims, 2 Drawing Sheets

MIXED DOMAIN MIXED RATIO FREQUENCY RESPONSE SAMPLING

FIELD OF THE INVENTION

The present invention relates to electronic test and measurement techniques, and more particularly relates to a method and apparatus for measuring characteristics of mixed domain sampled data systems.

BACKGROUND AND SUMMARY OF THE INVENTION

Mixed domain systems are those in which one signal is analog and the other is digital. In characterizing the response of such systems (i.e. the ratio of the output signal spectrum to the input linear signal spectrum), a dual channel signal analyzer may be used, with the digital signal being applied directly to one of the analyzer input channels, and with the analog signal being applied to a second analyzer input channel through an analog-to-digital converter internal to the instrument.

A twofold difficulty arises in making measurements on mixed domain systems. The first is in synchronizing the analog signal sample points with an external clock associated with the devices under test used to sample the digital signal. Such synchronization is required to maintain phase accuracy in the resulting measurements. The second difficulty is in providing alias protection for the sampled analog signal. This latter difficulty relates to the phenomenon inherent in sampled data systems wherein the spectrum of a sampled analog signal below one half the sampling frequency is replicated (mirrored) repeatedly around it.

To eliminate the aliasing problem, one approach is to filter the analog signal prior to sampling so as to insure that all spectral components above half the sampling frequency (which would otherwise be mirrored back into the baseband spectrum) are filtered out. However, this is impractical in a general purpose measurement system since the sampling frequency may range over several decades (perhaps 1 Hz to more than 25 KHz). It is difficult and expensive to design an analog filter that can be adaptable to such a broad range of cutoff frequencies.

FIG. 1 illustrates a representative mixed domain system 10 in which these difficulties are encountered, and illustrates a form of the present invention applied thereto. The analysis instrument 12 is a dual channel FFT instrument, such as the Hewlett-Packard 3563A, in which a microprocessor 14 (with associated program ROM 16 and scratchpad RAM 18) performs Fast Fourier Transforms (FFTs) on two channels of sampled input data. These transforms yield Fourier coefficients which are accumulated in "bins," one of which typically corresponds to each element of resolution on a spectral display 20 associated with the instrument. (FFT instruments are disclosed in greater detail in U.S. Pat. Nos. 4,932,062, 4,928,251, 4,918,381, 4,755,795 and 4,713,782, the disclosures of which are incorporated herein by reference.)

The analysis instrument 12 includes a digital signal source 22 that outputs a digital excitation signal. This excitation signal is applied to input channel 1 of the instrument as the reference signal, and is also provided to an external digital filter 24, which has a transfer function D*(s). (The * symbology refers to the starred transform. This transform is detailed, inter alia, in Phillips, et al, *Digital Control System Analysis and Design*, Prentice-Hall, pp. 69-75, 106-110 (1984).) The filter 24 operates with a clock frequency of $F_{s\,digital}$, and has a delay equal to $t_O$ seconds. The filtered digital signal is converted into analog form by a digital-to-analog converter 26, which has a transfer function of $e^{-st_O}[(1-e^{-sT})/s]$. (All digital filters require a finite amount of time to produce a result. This computational delay is modelled here as part of the digital-to-analog converter 26.)

The analog signal from the digital-to-analog converter 26 is applied to an analog circuit 28, which has a transfer function G(s). (The circuit 28 may, for example, be an analog filter circuit.) The analog output signal from circuit 28 is applied to input channel 2 of the instrument, where it is filtered by a low-pass filter 30. The filtered analog signal is converted into digital form for analysis by an analog-to-digital converter (ADC) 32 that samples the analog signal at a frequency $F_{s\,analog}$. (In the illustrated embodiment, all of the clocking/sampling signals are provided by a common clock circuit 34. In other embodiments, the clocking signals used in the mixed domain system 10 need not be synchronized with the analog and digital sampling signals.) The samples applied to the first and second input channels are clocked into a pair of 2048 byte (13-bit bytes) memories 36, 38 internal to the instrument. It is on the sampled data stored in these two memories that the FFT analyses are performed to determine the system transfer function.

The transfer function of the overall FIG. 1 system 10 can be described as follows:

$$Y(s)/E^*(s) = G(s)D^*(s)e^{-st_O}[(1-e^{-sT})/s] \qquad (1)$$

where E*(s) is the spectrum of the digital signal source 22, and Y(s) is the spectrum output by the analog circuit 28. (The term "transfer function" is not a technically accurate descriptor of this function due to its mixed domain character. It may more properly be considered a ratio of linear spectrums having practical significance.)

The analysis instrument 12 operates to divide out the E*(s) signal applied to channel 1 from the resultant signal applied to channel 2. However, this E*(s) signal is modified prior to application to the analog circuit 28 by the intervening digital filter 24, with its transfer function of D*(s). D*(s) has a periodic spectrum over $1/T = F_{s\,digital}$. The resulting spectrum is further modified by the digital-to-analog converter 26, with its transfer function $e^{-st_O}[(1-e^{-sT})/s]$.

The transfer function of the digital-to-analog converter 26 has a sin(x)/x rolloff (due to its sample and hold operation) which does not filter the replicated spectrum coming from D*(s) beyond $F_{s\,digital}/2$. Thus, if $T_o = T$, channel 2 will be an aliased measurement. As noted, it is impractical to design a low pass filter whose cutoff frequency can always be adjusted to $F_{s\,digital}/2$, since this represents a wide range of possible frequencies.

In accordance with one embodiment of the present invention, the foregoing aliasing and synchronization difficulties are overcome by sampling the analog channel at an integer multiple of the digital channel, and zero filling the set of sampled digital data so that it corresponds to the more densely sampled analog data. By so doing, measurements across a mixed domain boundary (such as the illustrated digital-to-analog converter 26)

can be made to determine frequency response above the classical $F_{s\ digital}/2$ Nyquist limit.

The foregoing and additional features and advantages of the present invention will be more readily apparent from the following detailed description, which proceeds with reference to the accompanying drawings.

DETAILED DESCRIPTION

Figure 1:
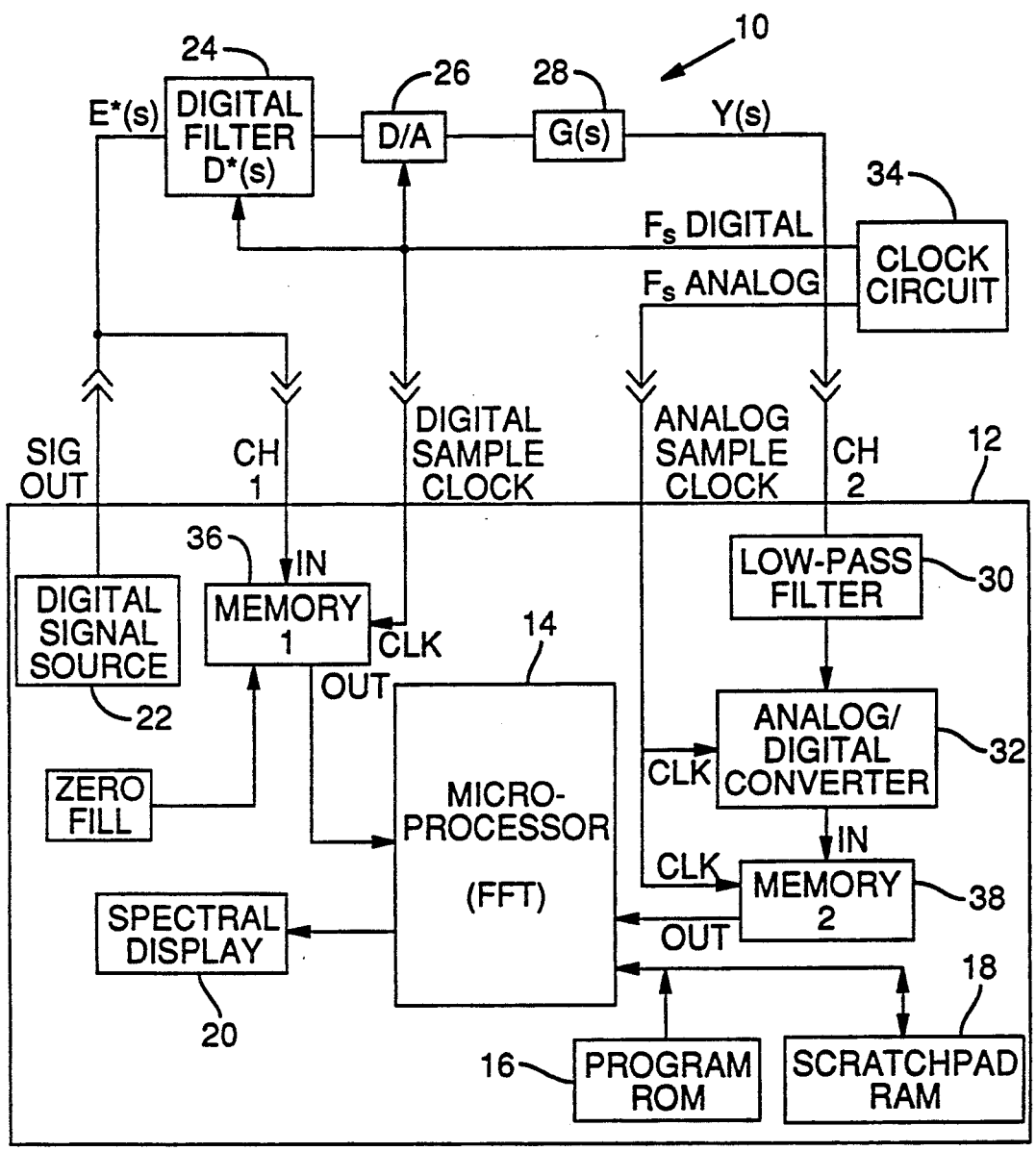
FIG. 1 illustrates the application of one form of the present invention to a representative mixed domain system.

Referring to FIG. 1, the synchronization and aliasing problems noted above are solved by sampling the analog output signal at an integer multiple of the digital input signal, and zero filling the set of sampled digital data so that it corresponds to the more densely sampled analog data set. In the illustrated embodiment, the integral multiple is four. That is, $F_{s\ analog} = 4*F_{s\ digital}$. The analog and digital sample clocks should be phase locked together but need not be synchronized (i.e. share zero crossings) with a clock signal used in the system under test.

Figure 3:
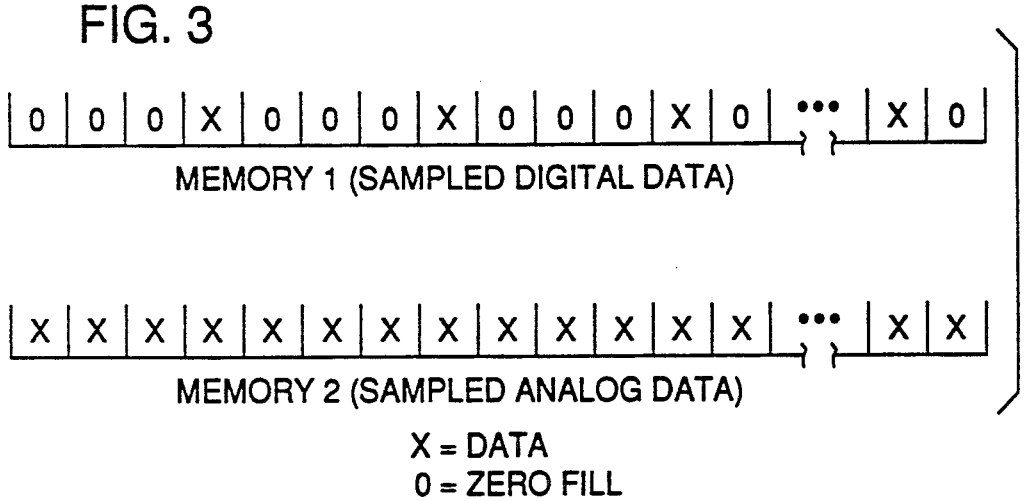
FIG. 3 illustrates representative digital and analog time records stored in the first and second instrument memories, and illustrates the zero filling used in the digital sample memory.

The use of zero filling in the digital data applied to the first channel causes the FFT "bins" resulting from analysis of this data (which is sampled at the slower frequency $F_{s\ digital}$) to spectrally align with the bins resulting from analysis of the sampled analog data (which is sampled at the higher frequency $F_{s\ analog}$). This zero filling is illustrated by FIG. 3, which maps the contents of the analyzer's first and second memories. The first memory (which contains the digital data) has zeroes repetitively interspersed therein to align with the corresponding data in the second memory (which contains the analog data).

Figure 2:
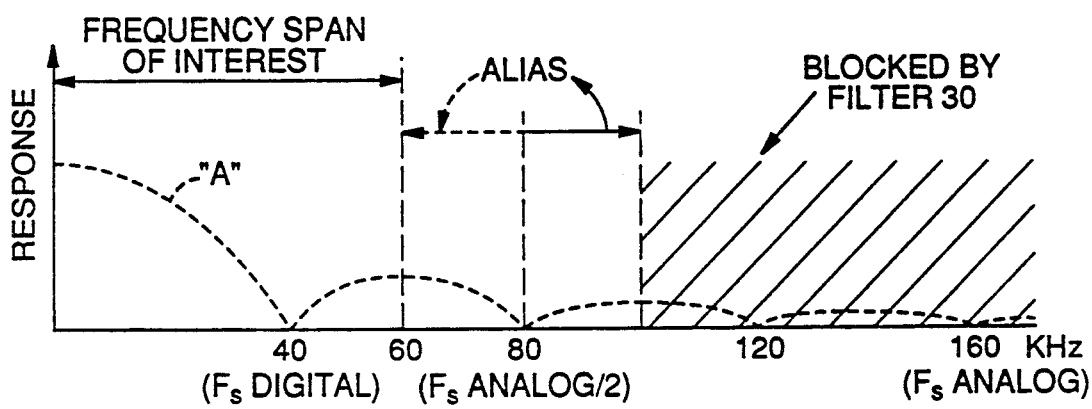
FIG. 2 illustrates certain spectral characteristics of measurements made in the FIG. 1 system.

FIG. 2 shows the spectral response of a representative digital-to-analog converter 26 when excited with pseudo-random noise (line "A"). In this example, the digital sample frequency $F_{s\ digital}$ is 40 KHz, the analog sample frequency $F_{s\ analog}$ is 160 KHz, the low pass cutoff frequency is fixed at 100 KHz, and the frequency span over which accurate analysis is desired is 0–60 KHz. Aliases of the portion of the analog signal above 80 KHz ($F_{s\ analog}/2$) are mirrored down below 80 KHz. That is, a component of the analog signal at 81 KHz is aliased back at 79 KHz, etc. The spectrum of interest (0–60 KHz), however, is guarded from these aliases by operation of the low pass filter, which attenuates components of the analog signal above 100 KHz (an ideal filter is presumed in this example).

The spectrum of interest between 0 and 60 KHz can be analyzed by "zooming" to see Y(s)/E*(s) with minimal alias error. ("Zooming" refers to a technique wherein a subband of a digital spectrum can be resolved with accuracy inversely proportional to the size of the subband by use of decimation. Zooming is disclosed, inter alia, in U.S. Pat. No. 4,881,191 and in Thong, "Fourier Analysis of Continuous Data Using DFTs," 1988 IEEE International Symposium on Circuits and Systems, pp. 1907-10, and in deWild et al, "Method for Partial Spectrum Computation," IEE Proc. F, Commun. Radar Signal Process. (UK), Vol.134, No.7 (Dec. 1987), pp.: 659-66. These disclosures are incorporated herein by reference.)

It will be recognized that the fortuitous circumstance noted above, whereby aliases are excluded from the 0–60 KHz spectrum by operation of the 100 KHz filter, depends on the analog sampling frequency $F_{s\ analog}$ and on the filter cutoff frequency. Basically, aliasing problems are eliminated by selecting $F_{s\ analog}$ so that $F_{s\ analog}/2$ falls at the halfway point between the highest frequency on the display span (i.e. 60 KHz) and the frequency at which the low pass filter provides substantial rejection. (In the illustrated embodiment, this frequency is assumed to be 100 KHz since an ideal filter is assumed.)

Stated another way, the ratio between $F_{s\ analog}$ and $F_{s\ digital}$ (hereafter referred to as the ratio "K") has a lower threshold below which aliasing will interfere with the desired measurement. The minimum ratio, $K_{min}$, can be computed as follows:

$$K_{min}=(F_{span}+F_{LP\ cutoff})/F_{s\ digital} \qquad (2)$$

where $F_{span}$ is the frequency span over which the transfer function is to be analyzed without alias interference (typically the highest frequency to be displayed on the instrument's spectral display), and $F_{LP\ cutoff}$ is the frequency at which the low pass filter 30 provides substantial attenuation. K is here selected by rounding $K_{min}$ up to the next highest integer. If a 60 KHz analysis span is desired using a filter with a cutoff frequency of 100 KHz and with a digital sample rate of 40 KHz, it can be seen that the ratio K must be at least 4. An analysis span arbitrarily close to the theoretical maximum of 0–100 KHz (the passband of the filter 36) can be provided by selecting K to be 5.

By phase locking the analog and digital sample clocks together, the resulting measurement can quantify the mixed domain transfer function in both the amplitude and phase domains. (A phase offset between the clocks is acceptable, provided it is constant over the measurement interval, thereby permitting subsequent processing to remove the phase offset effect. If the phase locking provides synchronous zero crossings, delays associated with the analog signal conditioning can sometimes cause the analog sample to be associated with a different measurement point than the corresponding digital sample.)

From the foregoing, it will be recognized that the present invention permits a single fixed frequency anti-alias filter to be used, in conjunction with ratioed analog and digital sample rates, to permit alias-free mixed domain measurements over any span of frequencies, up to the entire passband of the filter.

In other embodiments of the invention, the sample clocks need not be ratioed; the analog and digital sample clocks can have the same frequency. Surprisingly, they need not be synchronized (in the coincident zero crossing sense) with the clock used in the system under test, although they all generally have the same frequency.

In the illustrated system, the filter 30 is internal to the instrument 12 and cannot be bypassed. This is desirable in the ratioed sampling case since it yields an unaliased measurement. In the case where the sampling clocks have a one-to-one ratio (i.e. the DAC 26 clock rate in the system under test is identical to both the analog and digital sample clock rates), the filter can produce inaccuracies when measuring zero order hold functions of G(s). However, in other applications, this one-to-one ratio produces advantageous results, namely the Z domain step invariant transform of G(s). In this one-to-one case, the system "transfer function" is:

$$Y^*(s)/E^*(s) = [D^*(s)(1 - e^{-sT})G(s)]/E^*(s) \quad (3)$$
$$= (1 - e^{-sT})[G(s)/s]^* \quad (4)$$

Equation (4) is the step invariant transform of G(s) in the Z domain.

Having described and illustrated the principles of my invention with reference to an illustrative embodiment, it will be recognized that the invention can be modified in arrangement and detail without departing from such principles. For example, while the invention has been illustrated with reference to a system in which the sample clocks are integrally related, and zero filling is used to align the frequency bins resulting from analysis of the two data channels, in other embodiments this need not be the case. For example, if zero filling is not used, the Fourier coefficients produced from the first and second channels will usually be spaced with different frequency increments. However, their ratios can nonetheless be computed at the points they have in common. Further, in this non-zero filling case and in the nonintegral ratio case, interpolation may be employed to estimate spectral response data at points for which data is not directly available. Similarly, while the invention has been illustrated with a base band analysis system, it will be recognized that the principles of the invention are readily applicable to systems in which a spectrum of higher frequency signals are analyzed by frequency translation. While the invention has been illustrated with reference to a pseudo-random digital excitation signal, it will be recognized that other types of excitation signals can alternatively be used. Finally, while the invention has been described with reference to an embodiment in which the mixed domain measurement is made across a digital-to-analog boundary, it will be recognized that the principles of the invention can also be applied to other mixed domain situations, such as measurements across analog-to-digital boundaries.

In view of the many possible embodiments to which the principles of my invention may be put, it should be recognized that the detailed embodiment is illustrative only and should not be taken as limiting the scope of my invention. Rather, I claim as my invention all such embodiments as may come within the scope and spirit of the following claims and equivalents thereto.

I claim:

1. A mixed domain measurement method comprising the steps:
    sampling a digital signal at a first sampling frequency $F_1$;
    sampling an analog signal at a second sampling frequency $F_2$;
    filtering the sampled analog signal to attenuate signals beyond a cutoff frequency $F_{LP}$ that might be aliased back into a frequency span of interest and corrupt a measurement;
    wherein the frequency span $F_{span}$ can be adjusted without adjusting the cutoff frequency $F_{LP}$ by selecting F2 so it fulfills the following equation:

$$F_2 \geq (F_{span} + F_{LP}).$$

2. The method of claim 1 in which the ratio between the first and second sampling frequencies is an integral ratio.

3. The method of claim 1 in which $F_1 = F_2$.

4. The method of claim 1 which further includes the steps:
    storing a datum in an analog sample memory once every period, where said period equals 1/F2 seconds;
    storing a datum in a digital sample memory once every said period;
    wherein the data stored in the digital sample memory comprises samples of the digital source signal repetitively interspersed with one or more zeros so as to achieve equal numbers of data stored in the analog and digital memories over a predetermined period of time.

5. The method of claim 4 in which the ratio between the first and second sampling frequencies is an integral ratio.

6. A method of making measurements on a mixed domain system with a measurement instrument over a frequency span $F_{span}$, said system and instrument comprising a source of digital excitation signals, a digital-to-analog converter, an analog signal processing circuit, a low pass filter, and an analog-to-digital converter serially coupled together, the digital-to-analog converter having a first sampling frequency $F_{s\ digital}$, the analog-to-digital converter having a second sampling frequency $F_{s\ analog}$, and the low pass filter having a cutoff frequency $F_{LP}$, and the method comprising:
    setting a ratio between the second and first sampling frequencies to be greater than a limit L, where L is defined by the formula:

$$L = (F_{span} + F_{LP})/F_{s\ digital}.$$

7. A method of making measurements on a mixed domain system, said mixed domain system having both an analog signal and a digital signal, the method comprising the steps:
    sampling the analog signal using a first sampling clock signal at a first sampling frequency;
    sampling the digital signal using a second sampling clock signal at a second sampling frequency; and
    analyzing the sampled analog and digital signals;
    wherein the first and second sampling clock signals are phase locked with each other but do not share synchronous zero crossings.

8. The method of claim 7 in which the first and second sampling frequencies are identical to one another.

9. The method of claim 7 in which the analyzing step includes performing fast fourier transforms on the sampled analog and digital signals, and computing a transfer function therefrom.

10. The method of claim 9 in which the first and second sampling frequencies are equal to the system clock frequency.

* * * * *